Dec. 9, 1969 C. R. SAUBER 3,483,395
ELECTRONIC TIMING CIRCUIT
Filed Jan. 30, 1968
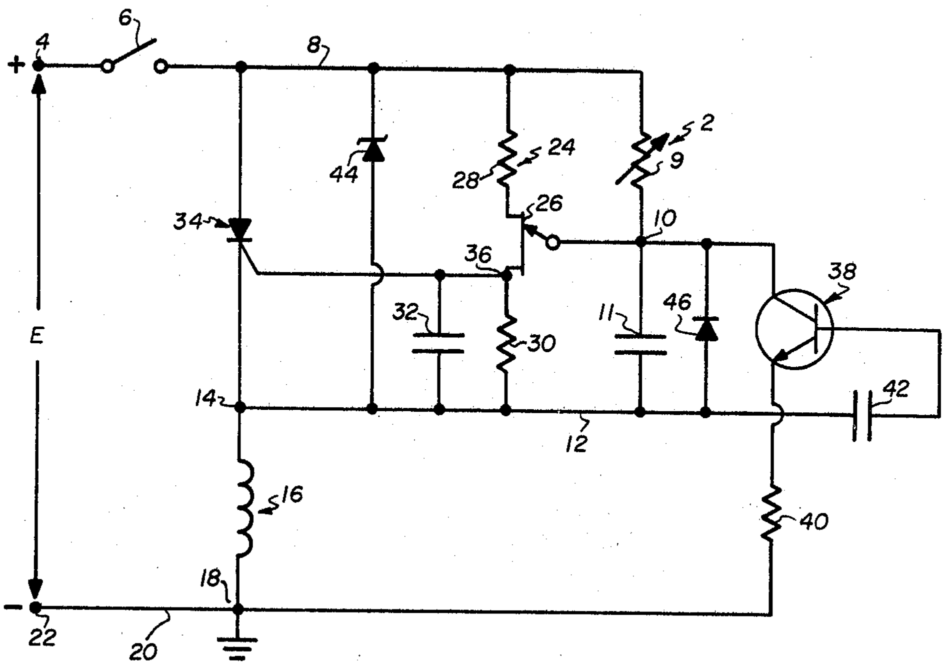
INVENTOR.
CHARLES R. SAUBER
BY Richard M. Rabkin
ATTORNEY 3,483,395

ELECTRONIC TIMING CIRCUIT

Charles R. Sauber, Cary, N.C., assignor to Cornell-Dubilier Electric Corporation, a corporation of Delaware Filed Jan. 30, 1968, Ser. No. 701,620
Int. Cl. H01h 7/00, 43/00; H03k 17/28
U.S. Cl. 307—141 6 Claims

ABSTRACT OF THE DISCLOSURE

A direct current operable delay timing circuit is disclosed which includes means for automatically discharging the timing capacitor upon completion of the timing cycle. Features of the circuit are especially effective for insuring consistent repeatability of the timing interval by effective discharge of the capacitor.

This invention relates to improved timing circuits and more particularly to a novel electronic timing circuit employing capacitor timing.

The increasing complexity of electrical and electronic equipments requires increased reliability and repeatability in their control circuits. Furthermore, it is desirable for such control or timing circuits to be as compact as possible.

It is an object of this invention to provide a novel timing circuit employing capacitor timing with the resistance-capacitance timing circuit de-energized when the delay has elapsed.

It is an object of this invention to provide an improved electronic timing circuit capable of repeated operations with a minimum variation of operation time from operation to operation.

It is another object of this invention to provide an improved electronic timing circuit having a short recycling time.

Other objects and advantages of the invention will be better understood from a study of the following disclosure when taken in conjunction with the accompanying drawing wherein:

The single figure in the drawing is a diagrammatic view of a preferred embodiment of the present invention.

In one aspect of the invention there is provided an improved direct current operable delay timing circuit which includes main switching means operable to start a delay timing interval. The circuit further includes first and second main bus connectors which are arranged to be energized under the control of the main switching means and a common bus. Electronic switching means are provided between the common bus and the first main bus conductor. The output device is connected between the common bus and the second main bus conductor. A timing network which is energized by the main bus conductors includes a series circuit having a resistor and a capacitor connected to each other at a junction with a firing circuit controlled by the junction. The firing circuit in turn controls the electronic switching means. An automatic discharging circuit is provided for the capacitor which circuit includes a normally nonconducting discharge device that has a control electrode responsive to the firing of the electronic switching means.

Referring to the drawing the improved direct current operable delay timing circuit includes means for charging a resistance-capacitance circuit wherein, when the capacitor reaches a predetermined voltage level, a timing transistor is switched providing a pulse for gating a silicon controlled rectifier connected in series with the timed load. Firing of the SCR in turn produces a pulse which operates a transistor switch to provide for the immediate and complete discharge of the timing capacitor thereby assuring that all subsequent starts of the timing circuit will be from the same voltage level. In the improved circuit to be described below, once the SCR has been fired the timing circuit is de-energized further insuring start of subsequent timing operations from the same capacitor condition.

Referring to the drawings, the novel delay timing circuit is illustrated connected to a D.C. source E. The charging circuit for the timing network 2 extends from the positive terminal 4 through main switch 6 to "positive" bus 8 to the timing network 2, which includes a variable resistor 9 connected at a junction 10 to a capacitor 11, via a "common" bus 12 to load terminal 14 through the output device or load 16 to load terminal 18 to "negative" bus 20 and then to the negative terminal 22. Load 16 may be the operating coil of a relay whose operation is controlled by the delay timing circuit. The junction 10 of resistor 9 and capacitor 11 is connected to the firing circuit 24 which includes a unijunction transistor 26. The base circuit of unijunction 26 extends from the positive bus 8 through a resistor 28, to the transistor 26, to a second resistor 30 and then to the common bus 12. A transient suppressing capacitor 32 is connected across resistor 30.

Electronic switch means in the form of a silicon controlled rectifier 34 is provided for controlling the energization of load 16. The SCR 34 is controlled by the firing circuit 24 since the gate circuit of the SCR 34 is connected to the junction 36 of the transistor 26 and resistor 30. The anode-cathode circuit of SCR 34 extends from the positive bus 8 through the SCR 34 to common bus 12 through the load 16 and then to the negative bus 20. A normally nonconducting discharge device in the form of a pulse operated transistor 38 has its emitter-collector circuit connected in series from junction 10 of resistor 9 and capacitor 11 through current limiting resistor 40 to the negative bus 20. The base of transistor 38 is connected through capacitor 42 to the common bus 12. The voltage applied to the timing circuit, which is connected across the silicon controlled rectifier, is clamped by a Zener diode 44 connected across the timing circuit.

In operation the closing of switch 6 initiates the charging of capacitor 11 through the variable resistor 9 and the load 16. When the charge on the capacitor exceeds a predetermined threshhold charge level the electronic switching means 34 is operated to connect the load 16 to the power supply E. The current flowing through the load 16 during the timing cycle is insufficient to cause pull-in of the relay so that the contacts of the relay (not shown) remain open until the SCR 34 has fired. The firing of the SCR 34 is controlled by the unijunction transistor 26. When the charge threshhold level is exceeded the transistor 26 is switched on which causes a voltage to appear across resistor 30. The junction 36 of the resistor 30 and the transistor 26 is connected to the gate circuit of the SCR 34 thus providing the gating signal required to initiate conduction of the electronic switching means. Until the switching means 34 becomes conductive the common bus 12 is at substantially the same voltage as the negative bus 20. When the SCR 34 becomes conductive the common bus is then effectively connected to the positive bus 8. The change in potential signifies the firing of the SCR and provides a pulse through capacitor 42 to the base of the normally nonconducting transistor 38. The pulse causes the transistor 38 to become conductive so that, so long as the pulse is present, the junction 10 of the timing circuit is connected to the negative bus 20 and the timing capacitor 11 is discharged so that subsequent timing operations will start from the same charge level.

The discharged state of the capacitor 11 assures that all subsequent timing operations will be of the same duration since the time to reach the threshhold charge level of the firing circuit will be the same since the capacitor starts from the same condition in each operation. The resistor 40 is used to provide a limitation of the discharge current rate through the transistor 38.

A diode 46 may be utilized to prevent the storage of an inverse charge in capacitor 11. The diode is polarized so as to be nonconducting during the buildup of charge in the timing interval and to become conducting when the potential of the common bus 12 changes due to firing of the SCR 34. This arrangement prevents loss of charge during the timing cycle and prevents storage of an inverse charge on the timing capacitor 11.

A delay timing circuit constructed according to the teachings of the present invention has been successfully operated over an adjustable time range up to 300 seconds. The duration of the timing interval depends upon the setting of the variable resistor 9. It will be recognized by those skilled in the art that the variable resistor 9 may be replaced by a fixed resistance so as to provide a fixed timing delay. In the present embodiment the variable resistor 9 was of the order of 3 megohms while the resistance of the load 16 was in the neighborhood of 1.35 kilohms. It will thus be seen that the resistance of the load has no effect on the delay interval obtained so that the described circuit may be used with a series of other relays. Relay to relay variations in resistance have no effect on the timing operation.

While only one embodiment of the invention has been shown and described it will be readily understood by those skilled in the art that various changes and modifications may be made without departing from the spirit and scope of the invention.

I claim:

1. A direct-current operable delay timing circuit, including main switching means operable to start a delay timing interval, first and second main bus conductors arranged to be energized under control of said main switching means, a common bus, electronic switching means between said common bus and said first main bus conductor, an output device between said common bus and said second main bus conductor, and a timing network energized by said main bus conductors, said timing network including a series circuit having a resistor and a capacitor connected to each other at a junction and arranged in the order named between said first main bus conductor and said common bus, a firing circuit controlled by said junction and in control of said electronic switching means, and an automatic discharging circuit for said capacitor including a normally non-conducting discharge device having a control electrode coupled to said common bus and responsive to the firing of said electronic switching means.

2. A delay timing circuit in accordance with claim 1 further including a solid state switching device responsive to a predetermined threshold charge level of said capacitor for firing said electronic switching means.

3. A delay timing circuit in accordance with claim 1 wherein said normally nonconducting discharge device has main electrodes connected respectively to said junction and to said second main bus conductor.

4. A delay timing circuit in accordance with claim 1 wherein said normally nonconducting discharge device has main electrodes connected respectively to said junction and to said second main bus conductor, further including a diode connected to said junction and arranged to prevent storage of inverse charge in said capacitor.

5. A delay timing circuit in accordance with claim 1 wherein said normally nonconducting discharge device has main electrodes connected respectively to said junction and to said second main bus conductor, further including a diode in parallel with said capacitor and polarized to be nonconducting during the buildup of charge in a timing interval.

6. A delay timing circuit in accordance with claim 5 further including a solid state switching device responsive to a predetermined threshold charge level of said capacitor for firing said electronic switching means.

References Cited

UNITED STATES PATENTS

| | | | |
|---|---|---|---|
| 3,182,227 | 5/1965 | Brittain et al. | |
| 3,281,810 | 10/1966 | Thornberg et al. | 307—293 X |
| 3,303,396 | 2/1967 | Culbertson et al. | |
| 3,320,440 | 5/1967 | Reed. | |
| 3,334,243 | 8/1967 | Cooper. | |

ROBERT K. SCHAEFER, Primary Examiner

T. B. JOIKE, Assistant Examiner

U.S. Cl. X.R.

307—293; 317—142